United States Patent
Chen et al.

(10) Patent No.: US 12,026,111 B2
(45) Date of Patent: Jul. 2, 2024

(54) METHOD AND SYSTEM OF LOW PIN COUNT (LPC) BUS SERIAL INTERRUPT

(71) Applicant: Phytium Technology Co., Ltd., Tianjin (CN)

(72) Inventors: Cai Chen, Tianjin (CN); Fudong Liu, Tianjin (CN); Lizheng Fan, Tianjin (CN); Xiaofan Zhao, Tianjin (CN)

(73) Assignee: Phytium Technology Co., Ltd., Tianjin (CN)

( * ) Notice: Subject to any disclaimer, the term of this patent is extended or adjusted under 35 U.S.C. 154(b) by 46 days.

(21) Appl. No.: 17/575,340

(22) Filed: Jan. 13, 2022

(65) Prior Publication Data

US 2022/0229793 A1    Jul. 21, 2022

(30) Foreign Application Priority Data

Jan. 15, 2021   (CN) .......................... 202110053101.5

(51) Int. Cl.
| | | |
|---|---|---|
| G06F 13/24 | (2006.01) | |
| G06F 13/28 | (2006.01) | |
| G06F 13/42 | (2006.01) | |
| H03K 19/017 | (2006.01) | |
| H03K 19/17784 | (2020.01) | |

(52) U.S. Cl.
CPC ............. *G06F 13/24* (2013.01); *G06F 13/28* (2013.01); *G06F 13/4282* (2013.01); *H03K 19/01728* (2013.01); *H03K 19/17784* (2013.01)

(58) Field of Classification Search
None
See application file for complete search history.

(56) References Cited

U.S. PATENT DOCUMENTS

| | | | | |
|---|---|---|---|---|
| 5,047,663 | A * | 9/1991 | Lee | H04L 25/028 326/62 |
| 5,754,436 | A * | 5/1998 | Walsh | G06F 9/30083 700/286 |
| 5,821,777 | A * | 10/1998 | Tanoi | G11C 7/1069 326/82 |
| 6,217,213 | B1 * | 4/2001 | Curry | G11C 8/20 374/102 |
| 7,062,595 | B2 * | 6/2006 | Lindsay | H04L 12/12 710/105 |
| 9,337,931 | B2 * | 5/2016 | Srinivas | H04B 10/27 |
| 10,725,844 | B2 * | 7/2020 | Dougherty | G11C 11/417 |
| 10,965,221 | B1 * | 3/2021 | Bassi | H02M 7/483 |

(Continued)

FOREIGN PATENT DOCUMENTS

| | | |
|---|---|---|
| CN | 102047235 A | 5/2011 |
| CN | 103914424 A | 7/2014 |

(Continued)

*Primary Examiner* — Henry Tsai
*Assistant Examiner* — Christopher A Bartels
(74) *Attorney, Agent, or Firm* — ANOVA LAW GROUP, PLLC

(57) ABSTRACT

A low pin count (LPC) bus serial interrupt system includes: an interrupt direction signal generator configured to determine a current interrupt direction signal according to whether a host currently sends a first interrupt signal to an external device; and a level-shifter configured to convert a voltage level of a signal exchanged between the host and the external device according to the current interrupt direction signal.

20 Claims, 7 Drawing Sheets

(56) References Cited

U.S. PATENT DOCUMENTS

| | | | | |
|---|---|---|---|---|
| 11,513,991 | B2* | 11/2022 | Wietfeldt | G06F 13/4282 |
| 2002/0194415 | A1* | 12/2002 | Lindsay | G06F 1/3203 |
| | | | | 710/305 |
| 2007/0080905 | A1* | 4/2007 | Takahara | G09G 3/3258 |
| | | | | 345/76 |
| 2013/0108263 | A1* | 5/2013 | Srinivas | H04L 12/28 |
| | | | | 398/58 |
| 2013/0279909 | A1* | 10/2013 | Srinivas | H04B 10/27 |
| | | | | 398/58 |
| 2015/0350023 | A1* | 12/2015 | Srinivas | H04Q 3/0083 |
| | | | | 370/254 |
| 2016/0056823 | A1* | 2/2016 | Ho | H03K 19/0185 |
| | | | | 326/41 |
| 2018/0121277 | A1* | 5/2018 | Dougherty | G06F 11/0793 |
| 2019/0265976 | A1* | 8/2019 | Goryavskiy | G06F 9/3016 |
| 2019/0306281 | A1* | 10/2019 | Masputra | G06F 16/2365 |
| 2022/0108736 | A1* | 4/2022 | Madhavan | G11C 5/06 |
| 2023/0215340 | A1* | 7/2023 | Choi | G06F 3/0412 |
| | | | | 345/174 |

FOREIGN PATENT DOCUMENTS

| | | |
|---|---|---|
| CN | 105512070 A | 4/2016 |
| CN | 108763140 A | 11/2018 |
| CN | 209433401 U | 9/2019 |

* cited by examiner

METHOD AND SYSTEM OF LOW PIN COUNT (LPC) BUS SERIAL INTERRUPT

CROSS-REFERENCE TO RELATED APPLICATION

This application claims priority to Chinese Patent Application No. 202110053101.5, filed on Jan. 15, 2021, the entire content of which is incorporated herein by reference.

TECHNICAL FIELD

The present disclosure relates to the technical field of processor technology and, more particularly, to a method and a system of a low pin count (LPC) bus serial interrupt.

BACKGROUND

The LPC bus is a 33 MHz 4-bit parallel bus protocol based on an Intel standard for replacing a previous industry standard architecture (ISA) bus.

The LPC supports two interrupt modes: a serial interrupt request (SerIRQ) interrupt mode and a direct memory access (DMA) interrupt mode. The SerIRQ interrupt is hereinafter referred to as a serial interrupt, which is different from a commonly seen voltage level interrupt. The commonly seen voltage level interrupt achieves interrupt reporting by pulling up or down a voltage level at a corresponding input/output (I/O) interface. A structure of a SerIRQ signal of the serial interrupt includes a start frame, an interrupt bit, and an end frame. The DMA interrupt and the serial interrupt go through different hardware. The DMA submits an interrupt request to a LPC controller of a central processing unit (CPU) through a LPC bus DMA request (LDRQ) signal line. An external device (referred to as a peripheral) sends an interrupt request to the CPU of a host through either a SerIRQ signal line or the LDRG signal line. After receiving the interrupt request, the CPU executes a corresponding interrupt processing operation.

Therefore, signal exchange is needed between the peripheral and the host.

SUMMARY

One aspect of the present disclosure provides a low pin count (LPC) bus serial interrupt system. The system includes: an interrupt direction signal generator configured to determine a current interrupt direction signal according to whether a host currently sends a first interrupt signal to an external device; and a level-shifter configured to convert a voltage level of a signal exchanged between the host and the external device according to the current interrupt direction signal.

Another aspect of the present disclosure provides a low bit count (LPC) bus serial interrupt method. The method includes: determining a current interrupt direction signal according to whether a host currently sends a first interrupt signal to an external device; and converting a voltage level of a signal exchanged between the host and the external device according to the current interrupt direction signal.

Another aspect of the present disclosure provides a computer-readable storage medium storing a low pin count (LPC) bus serial interrupt software product. The computer-readable storage medium includes one or more computer-executable instructions. When being executed by a processor, the one or more computer-executable instructions performs: determining a current interrupt direction signal according to whether a host currently sends a first interrupt signal to an external device; and converting a voltage level of a signal exchanged between the host and the external device according to the current interrupt direction signal.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
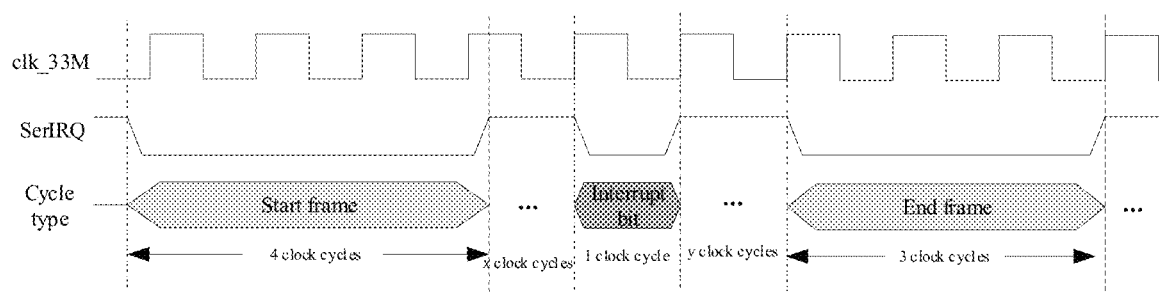
FIG. 1 illustrates a schematic diagram of a waveform of an interrupt signal in a static mode of an exemplary LPC serial interrupt according to some embodiments of the present disclosure.

Various features and embodiments of the present disclosure are described in detail below with reference to the accompanying drawings. In the description below, numerous specific details are proposed to provide a comprehensive understanding of the present disclosure. However, for those skilled in the art, the present disclosure may be implemented without some of the specific details. The description of the embodiments below is intended to provide a better understanding of the present disclosure through examples. In the drawings and the specification below, certain well-known structures and technical details are not shown to avoid unnecessary ambiguity. For clarity, dimensions of certain structures may be expanded to show structural details. In addition, the features, structures, or characteristics described below may be combined in one or more embodiments in any suitable manner.

In the description of the present disclosure, it should be noted that, unless otherwise specified, "plurality" means two or more. The orientation or position relationship indicated by terms "upper," "lower," "left," "right," "inner," and "outer" are only for the convenience and simplification of describing the present disclosure, do not indicate or imply that a device or an element referred herein must have a specific orientation or must be constructed and operated in a specific orientation, and hence cannot be construed as limiting the present disclosure. In addition, terms "first" and "second" are only used for illustration purpose, and cannot be construed as indicating or implying relative importance.

Words appeared in the description below for describing directions refer to directions in the drawings, and do not limit a specific structure of the embodiments of the present disclosure. In the description of the present disclosure, it should be noted that, unless otherwise clearly specified and limited, terms "installation" and "connection" should be interpreted in a broad sense. For example, the terms may refer to a fixed connection, a detachable connection, or an integral connection. The connection may be direct or indirect. For those of ordinary skill in the art, the specific meaning of the above-mentioned terms in the specification can be interpreted according to specific circumstances.

A low pin count (LPC) serial interrupt includes a static mode and a continuous mode.

FIG. 1 illustrates a schematic diagram of a waveform of an interrupt signal in a static mode of an exemplary LPC serial interrupt according to some embodiments of the present disclosure. When an LPC interrupt is in the static mode and no interrupt signal is present on a LPC bus, an interrupt line is high. When an external device or a peripheral needs to report an interrupt to a CPU, a start frame sent by the CPU, an interrupt bit sent by the external device, and an end frame sent by the CPU are sent to a SerIRQ interrupt signal all at one time.

Figure 2:
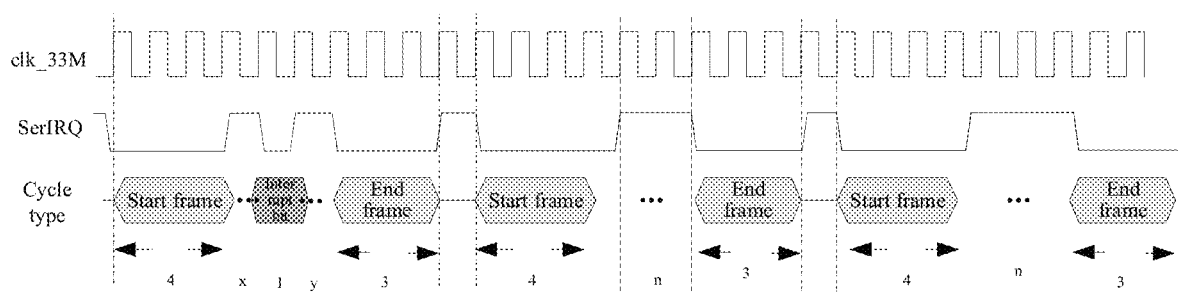
FIG. 2 illustrates a schematic diagram of a waveform of an interrupt signal in a continuous mode of an exemplary LPC serial interrupt according to some embodiments of the present disclosure.

FIG. 2 illustrates a schematic diagram of a waveform of an interrupt signal in a continuous mode of an exemplary LPC serial interrupt according to some embodiments of the present disclosure. When the LPC interrupt is in the continuous mode, regardless of whether the external device reports an interrupt or not, the CPU always sends the start frame and the end frame to the external device. When the external device needs to report an interrupt to the CPU, the external device detects a position of a start frame, pulls down, at a position corresponding to an interrupt signal of the external device, a voltage level of the SerIRQ interrupt line of a corresponding moment, and sends the pulled-down voltage level signal to the CPU. After the CPU sends the end frame, the interrupt is reported to a general interrupt controller (GIC) circuit of the CPU. Then, the GIC circuit of the CPU processes the interrupt.

Therefore, the external device and the host are required to exchange signals multiple times.

Because the CPU is often fabricated with advanced technologies, the CPU requires a low operating voltage, such as 1.8 V, to reduce a power consumption of the CPU. On the other hand, the external device is often small in size because fewer chips and transistors as compared with the CPU are included, and does not require advanced technologies during fabrication, thereby resulting in a high operating voltage, such as 3.3 V. When the CPU and the external device exchange signals, if the voltage levels are not converted, a signal at the high operating voltage can be inputted to a low-operating-voltage hardware and burn the low-operating-voltage hardware. On the other hand, a high-level signal outputted by the low-operating-voltage hardware that is inputted to a high-operating-voltage hardware may be incorrectly determined to be a low-level signal. Thus, the signals exchanged between the CPU and the external device need to be level-shifted, such that a receiving end receives a level-shifted signal. Generally, a specialized and complicated level-shifter circuit is used to shift a voltage level by comparing with a reference voltage, which requires hardware cost and time cost, and results in potential incorrect determination.

Figure 3:
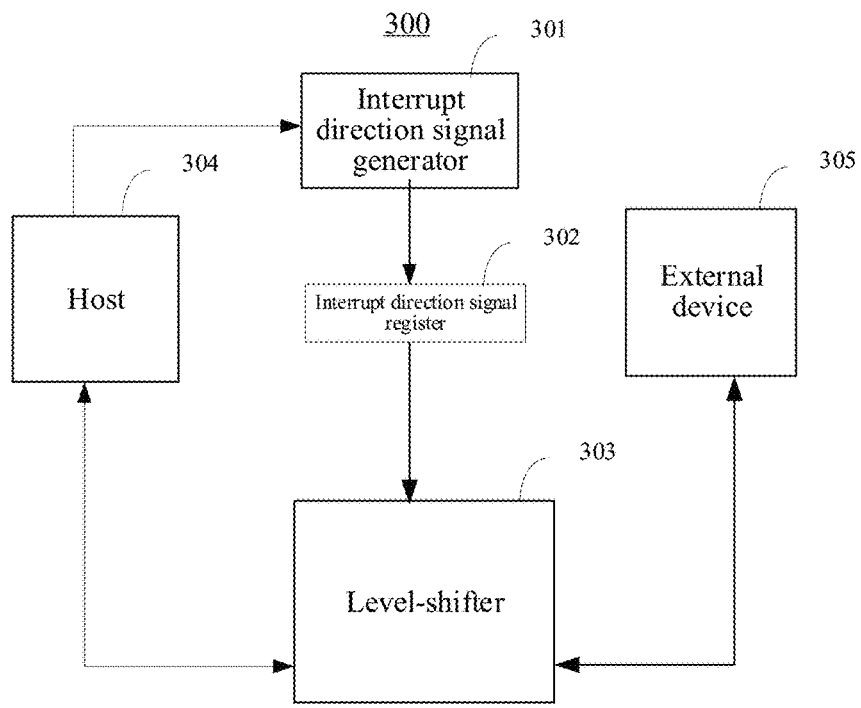
FIG. 3 illustrates a schematic block diagram of an exemplary LPC serial interrupt system according to some embodiments of the present disclosure.

FIG. 3 illustrates a schematic block diagram of an exemplary LPC serial interrupt system according to some embodiments of the present disclosure.

In some embodiments, as shown in FIG. 3, the LPC serial interrupt system 300 includes a host 304 and an external device 305. The host 304 and the external device 305 send interrupt signals to each other. The LPC serial interrupt system 300 further includes: an interrupt direction signal generator 301 configured to determine a current interrupt direction signal SerIRQ_dir according to whether the host 304 currently sends a first interrupt signal to the external device 305, and a level-shifter 303 configured to shift a voltage level of a signal exchanged between the host 304 and the external device 305 according to the current interrupt direction signal SerIRQ_dir.

In some embodiments, the interrupt direction signal generator 301 is configured to perform the following steps to determine the current interrupt direction signal SerIRQ_dir according to whether the host 304 currently sends a first interrupt signal to the external device 305. When the host 304 currently sends the first interrupt signal to the external device 305, the current interrupt direction signal SerIRQ_dir is determined to be from the host 304 to the external device 305, and a first signal indicating a direction from the host 304 to the external device 305 is generated. For example, the first signal is a one-bit value 1, indicating that the host 304 outputs an interrupt signal. When the host 304 currently does not send the first interrupt signal to the external device 305, the current interrupt direction signal SerIRQ_dir is determined to be from the external device 305 to the host 304, and a second signal indicating a direction from the external device 305 to the host 304 is generated. For example, the second signal is a one-bit value 0, indicating that the host 304 inputs an interrupt signal. The one-bit values 1 and 0 are for illustration purpose. In actual implementation, other values may be used. In this case, the host 304 is used as a reference for input and output because the host 304 is an actor of sending and receiving interrupt signals, and has the knowledge of whether the host 304 is sending or receiving interrupt signals.

As such, no complicated circuit design is needed to rapidly and efficiently shift the voltage level of the signals exchanged between the host and the external device according to the current interrupt direction signal.

Figure 4A:
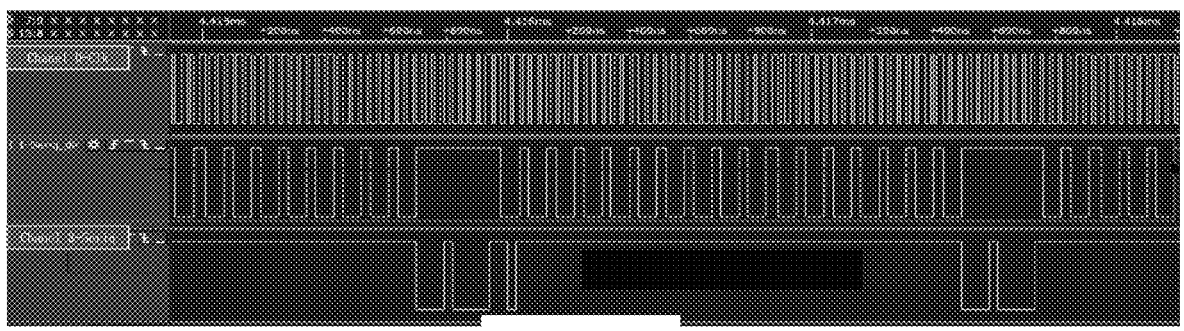
FIG. 4A illustrate a timing diagram of a SerIRQ interrupt line and a SerIRQ_dir interrupt direction signal line in a continuous mode according to some embodiments of the present disclosure.
Figure 4B:
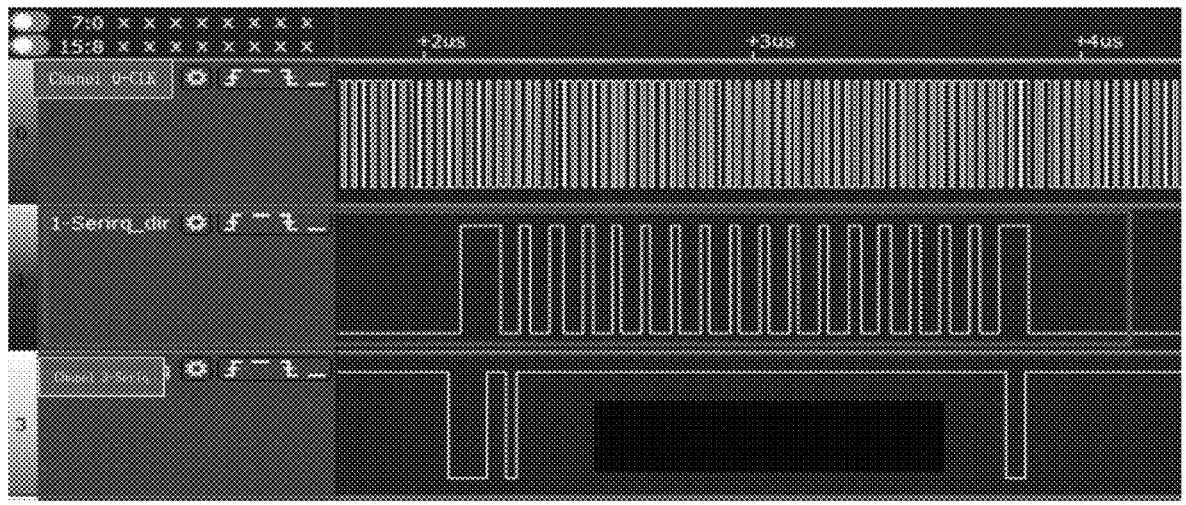
FIG. 4B illustrate a timing diagram of a SerIRQ interrupt line and a SerIRQ_dir interrupt direction signal line in a static mode according to some embodiments of the present disclosure.

FIG. 4A illustrate a timing diagram of a SerIRQ interrupt line and a SerIRQ_dir interrupt direction signal line in a continuous mode according to some embodiments of the present disclosure. FIG. 4B illustrate a timing diagram of a SerIRQ interrupt line and a SerIRQ_dir interrupt direction signal line in a static mode according to some embodiments of the present disclosure.

In some embodiments, the first interrupt signal includes one of an interrupt start signal and an interrupt end signal. In the continuous mode, the first interrupt signal includes both the interrupt start signal and the interrupt end signal. The interrupt start signal is, for example, the start frame shown in FIG. 1 or FIG. 2, which often occupies 4 clock cycles to indicate a start of the interrupt signal. In the 4 clock cycles of the start frame, the voltage level of the SerIRQ interrupt line is pulled down, and the interrupt end signal is, for example, the end frame shown in FIG. 1 or FIG. 2, which often occupies 3 clock cycles to indicate an end of the interrupt signal. In the 3 clock cycles of the end frame, the voltage level of the SerIRQ interrupt line is pulled down. In the static mode, the first interrupt signal includes only the interrupt end signal because in the static mode, the start frame is not sent by the host, but is sent by the external device.

In some embodiments, in the continuous mode, the interrupt direction signal generator 301 determines that the current interrupt direction signal SerIRQ_dir is from the host 304 to the external device 305 when the host 304 currently sends the start frame or the end frame to the external device 305, and generates the first signal that indicates the direction from the host 304 to the external device 395. When the host 304 currently does not send the first interrupt signal to the external device 305, the interrupt direction signal generator 301 determines that the current interrupt direction signal SerIRQ_dir is from the external device 305 to the host 304, and generates the second signal that indicates the direction from the external device 305 to the host 304. In some other embodiments, the host 304 may actively report to the interrupt direction signal generator 301 whether the host currently sends out signals or not, such that the interrupt direction signal generator 301 sends out the interrupt direction signal SerIRQ_dir accordingly.

In some embodiments, the interrupt direction signal generator 301 is configured to: determine that the external device 305 currently sends the second interrupt signal to the host 304 when the host 304 currently does not send the first interrupt signal to the external device 305, determine that the current interrupt direction signal SerIRQ_dir is from the external device 305 to the host 304, and generate the second signal that indicates the direction from the external device 305 to the host 304.

In some embodiments, in the continuous mode, the second interrupt signal includes an external device interrupt identification signal. The external device interrupt identification signal is, for example, a portion that includes the interrupt bit except for the start frame and the end frame, as shown in FIG. 1 or FIG. 2. For example, the external device interrupt identification signal occupies n clock cycles, where n is a positive integer and is related to a quantity of external devices connected to the LPC bus. When the (x+1)th external device requests an interrupt, the voltage level of the SerIRQ interrupt line is pulled down at the (x+1) clock cycle, that is, an interrupt bit is generated, and x is a positive integer. In subsequent y clock cycles, the voltage level is not pulled down, indicating that no other external devices request interrupts, and y is a positive integer. In other words, one interrupt bit corresponds to one interrupt request from one external device. A position of the interrupt bit in the external device identification signal indicates which external device issued the interrupt request. As shown in FIG. 1 or FIG. 2, x+1+y=n. In the static mode, the second interrupt signal includes the external device interrupt identification signal and the interrupt start signal. As described, in the static mode, the start frame is not sent by the host, but by the external device.

Because, the host is used as the reference for input and output, the host not sending a signal at a time can be interpreted as the external device potentially sending a signal at the time. Thus, when the host 304 currently does not send the first interrupt signal to the external device 305, it is determined that the external device 305 currently sends the second interrupt signal to the host 304.

In some embodiments, the LPC serial interrupt system 300 further includes an interrupt direction signal register 302 configured to register the first signal or the second signal currently generated. The level-shifter 303 is configured to perform the following steps to convert the voltage level of the signals exchanged between the host 304 and the external device 305 according to the current interrupt direction signal SerIRQ_dir. A signal is retrieved from the interrupt direction signal register 302. If the signal retrieved from the interrupt direction signal register 302 is the first signal, the voltage level of the signal sent by the host 304 is changed from the voltage level operated by the host 304 to the voltage level operated by the external device 305. If the signal retrieved from the interrupt direction signal register 302 is the second signal, the voltage level of the signal sent by the externa; device 305 is changed from the voltage level operated by the external device 305 to the voltage level operated by the host 304.

Table 1 below shows description of signals in the LPC serial interrupt system 300.

TABLE 1

| Signal name | Host direction | Description |
| --- | --- | --- |
| clk_33m | I | Controller internal clock signal |
| rst_n | I | Reset signal |
| SerIRQ_dir | O | Serial interrupt direction signal (binary 1 indicates output from the host, binary 0 indicates input into the host) |
| SerIRQ | I/O | Serial interrupt signal |
| Ldrq | I | DMA or bus host request signal, support single channel DMA request |

In some embodiments, the level-shifter 303 is implemented in a complex programmable logic device (CPLD) or a field programmable gate array (FPGA) device.

Figure 5A:
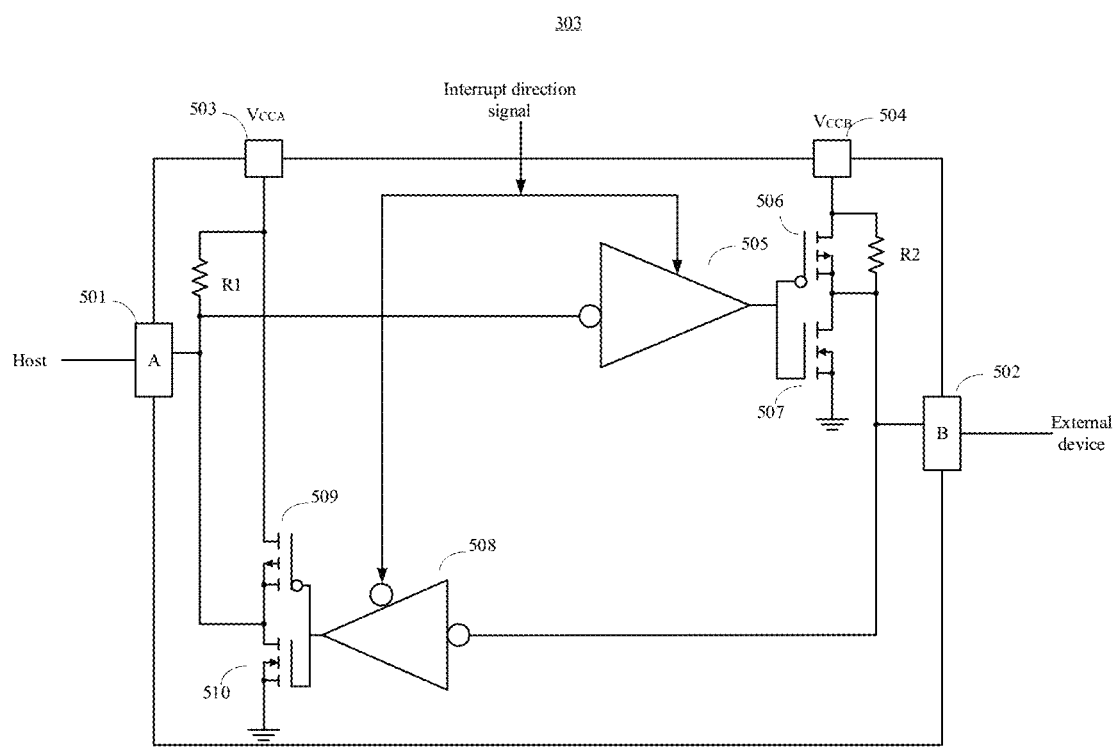
FIG. 5A illustrates an internal circuit diagram of an exemplary level-shifter according to some embodiments of the present disclosure.

FIG. 5A illustrates an internal circuit diagram of an exemplary level-shifter 303 (or first level-shifter) according to some embodiments of the present disclosure.

The level-shifter 303 includes a host connection terminal A 501 connected to the host and an external device connection terminal B 502 connected to the external device.

The level-shifter 303 further includes a host power supply VCCA 503 and an external device power supply VCCB 504. For example, the host power supply VCCA is 1.6 V, and the external power supply VCCB is 3.3 V.

The level-shifter 303 further includes a first inverter 505. A first input terminal of the first inverter 505 is connected to the host connection terminal A 501, and a second input terminal of the first inverter 505 receives the interrupt direction signal. The interrupt direction signal being 1 indicates that a signal is currently sent from the host to the external device. At this time, the interrupt direction signal has a high voltage level (e.g., 1.6 V) to enable the first inverter 505. The interrupt direction signal being 0 indicates that a signal is currently sent from the external device to the host. At this time, the interrupt direction signal has a low voltage level (e.g., 0 V) to disable the first inverter 505. In some embodiments, the voltage level of the interrupt direction signal and a mechanism for enabling or disabling the first inverter 505 may be configured according to specific implementations, and may not be limited by the present disclosure.

The level-shifter 303 further includes a first PMOS transistor P1 506. A drain electrode of the first PMOS transistor P1 506 is connected to the external device power supply 504. A source electrode of the first PMOS transistor P1 506 is connected to the external device connection terminal B 502 and a drain electrode of a first NMOS transistor N1 507. A gate electrode of the first PMOS transistor P1 506 is connected to an output terminal of the first inverter 505.

The level-shifter 303 further includes the first NMOS transistor N1 507. A source electrode of the first NMOS transistor N1 507 is grounded. A gate electrode of the first NMOS transistor N1 507 is connected to the output terminal of the first inverter 505.

The first PMOS transistor P1 506 and the first NMOS transistor N1 507 together also form an inverter.

The first inverter 505, the first PMOS transistor P1 506, the first NMOS transistor N1 507 are responsible for raising the voltage level of the signal from the host received by the host connection terminal A 501 to the voltage level suitable for the external device according to the interrupt direction signal.

In some embodiments, when the interrupt direction signal is 1, it indicates that the signal is currently sent from the host to the external device. At this time, the interrupt direction signal has the high voltage level (e.g., 1.6 V) to enable the first inverter 505. The output terminal of the first inverter 505 outputs the low voltage level (e.g., 0 V). Thus, the first NMOS transistor N1 507 is turned off, and the first PMOS transistor P1 506 is turned on. The voltage level that the external device connection terminal B 502 outputs to the external device is changed to the external device power supply voltage VCCB, that is, 3.3 V. On the other hand, when the interrupt direction signal is 0, it indicates that the signal is currently sent from the external device to the host. At this time, the interrupt direction signal has the low voltage level (e.g., 0 V) to disable the first inverter 505.

The level-shifter 303 further includes a second inverter 508. A first input terminal of the second inverter 508 is connected to the external device connection terminal B 502. A second input terminal of the second inverter 508 receives the interrupt direction signal. The interrupt direction signal being 1 indicates that the signal is currently sent from the host to the external device. At this time, the interrupt direction signal has a high voltage level (e.g., 1.6 V) to disable the second inverter 508. The interrupt direction signal being 0 indicates that the signal is currently sent from the external device to the host. At this time, the interrupt direction signal has a low voltage level (e.g., 0 V) to enable the second inverter 508.

The level-shifter 303 further includes a second PMOS transistor P2 509. A drain electrode of the second PMOS transistor P2 509 is connected to the host power supply 503. A source electrode of the second PMOS transistor P2 509 is connected to the host connection terminal A 501 and a drain electrode of a second NMOS transistor N2 510. A gate electrode of the second PMOS transistor P2 509 is connected to an output terminal of the second inverter 508.

The level-shifter 303 further includes the second NMOS transistor N2 510. A source electrode of the second NMOS transistor N2 510 is grounded. A gate electrode of the second NMOS transistor N2 510 is connected to the output terminal of the second inverter 508.

The second PMOS transistor P2 509 and the second NMOS transistor N2 510 together also form another inverter.

The second inverter 508, the second PMOS transistor P2 509, the second NMOS transistor N2 510 are responsible for lowering the voltage level of the signal from the external device received by the external device connection terminal B 502 to the voltage level suitable for the host according to the interrupt direction signal.

In some embodiments, when the interrupt direction signal is 1, it indicates that the signal is currently sent from the host to the external device. At this time, the interrupt direction signal has the high voltage level (e.g., 1.6 V) to disable the second inverter 508. On the other hand, when the interrupt direction signal is 0, it indicates that the signal is currently sent from the external device to the host. At this time, the interrupt direction signal has the low voltage level (e.g., 0 V) to enable the second inverter 508. The output terminal of the second inverter 508 outputs the low voltage level (e.g., 0 V). Thus, the second NMOS transistor N2 510 is turned off, and the second PMOS transistor P2 509 is turned on. The voltage level that the host connection terminal A 501 outputs to the host is changed to the host power supply voltage VCCA, that is, 1.6 V.

In addition, the LPC serial interrupt system 300 further includes a resistor R1. One end of the resistor R1 is connected to the host power supply VCCA 503. Another end of the resistor R1 is connected to the host connection terminal A 501, the first input terminal of the first inverter 505, the source electrode of the second PMOS transistor P2 509, and the drain electrode of the second NMOS transistor N2 510. The LPC serial interrupt system 300 further includes a resistor R2. One end of the resistor R2 is connected to the external device power supply VCCB 504. Another end of the resistor R2 is connected to the external device connection terminal B 502, the first input terminal of the second inverter 508, the source electrode of the first PMOS transistor P1 506, and the drain electrode of the first NMOS transistor N1 507.

As such, the level-shifter 303 shown in FIG. 5A may convert the voltage level between the host and the external device according to the interrupt direction signal.

In some embodiments, the LPC serial interrupt system 300 further includes: an interrupt mask register (not shown) configured to register an interrupt mask bit. When the interrupt mask bit is a pre-determined bit, the interrupt mask bit is used to mask the second interrupt signal from the external device to the host. That is, even if the external device 305 sends an interrupt request to the host 304, the host 304 does not perform an interrupt operation.

Figure 5B:
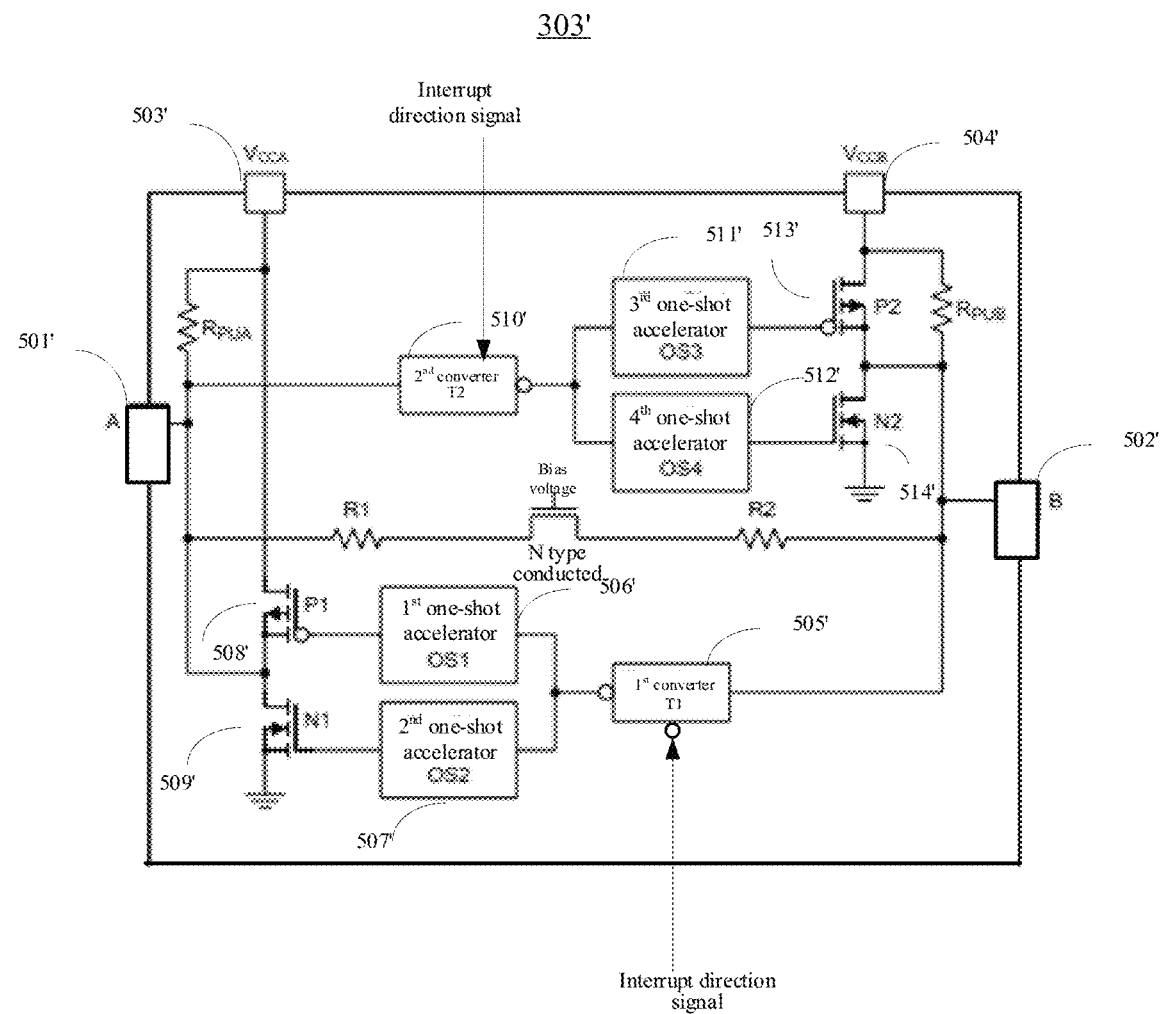
FIG. 5B illustrates an internal circuit diagram of another exemplary level-shifter according to some embodiments of the present disclosure.

FIG. 5B illustrates an internal circuit diagram of another exemplary level-shifter 303' (or second level-shifter) according to some embodiments of the present disclosure.

The level-shifter 303' includes a host connection terminal A 501' connected to the host and an external device connection terminal B 502' connected to the external device. The host connection terminal A and the external device connection terminal B also receive the interrupt direction signal from the interrupt direction signal generator 301 or the interrupt direction signal register 302 to learn the current signal direction.

The level-shifter 303' further includes a host power supply VCCA 503' and an external device power supply VCCB 504'. For example, the host power supply VCCA is 1.6 V, and the external power supply VCCB is 3.3 V.

The level-shifter 303' further includes a first converter T1 505'. A first input terminal of the first converter T1 505' is connected to the external device connection terminal B 502', a second input terminal of the first converter T1 505" receives the interrupt direction signal from the interrupt direction signal generator, and an output terminal of the first converter T1 505' is connected to input terminals of a first one-shot accelerator OS1 506' and a second one-shot accelerator OS2 507'.

The level-shifter 303' further includes a first PMOS transistor P1 508'. A drain electrode of the first PMOS transistor P1 508' is connected to the host power supply 503'. A source electrode of the first PMOS transistor P1 508' is connected to the host connection terminal A 501' and a drain electrode of a first NMOS transistor N1 509'. A gate electrode of the first PMOS transistor P1 508' is connected to an output terminal of the first one-shot accelerator OS1 506'.

The level-shifter 303' further includes the first NMOS transistor N1 509'. A source electrode of the first NMOS transistor N1 509' is grounded. A gate electrode of the first NMOS transistor N1 509' is connected to an output terminal of the second one-shot accelerator OS2 507'.

The level-shifter 303' further includes a second converter T2 510'. An input terminal of the second converter 510' is connected to the host connection terminal A 501'. An output terminal of the second converter 510' is connected to input terminals of a third one-shot accelerator OS3 511' and a fourth one-shot accelerator OS4 512'.

The level-shifter 303' further includes a second PMOS transistor P2 513'. A drain electrode of the second PMOS transistor P2 513' is connected to the external device power supply 504'. A source electrode of the second PMOS transistor P2 513' is connected to the external connection terminal B 502' and a drain electrode of a second NMOS transistor N2 514'. A gate electrode of the second PMOS transistor P2 513' is connected to an output terminal of the third one-shot accelerator OS3 511'.

The level-shifter 303' further includes the second NMOS transistor N2 514'. A source electrode of the second NMOS transistor N2 514' is grounded. A gate electrode of the second NMOS transistor N2 514' is connected to an output terminal of the fourth one-shot converter OS4 512'.

When the interrupt direction signal indicates that the signal is transmitted from the host connection terminal A 501' to the external device connection terminal B 502', during a rising edge, the third one-shot accelerator OS3 511' turns on the second PMOS transistor P2 513' for a short period of time, thereby reducing a transition time from the low voltage level to the high voltage level. Similarly, during a falling edge, when the signal is transmitted from the host connection terminal A 501' to the external device connection terminal B 502', the fourth one-shot accelerator OS4 512' turns on the second NMOS transistor N2 514' for a short period of time, thereby speeding up a transition from the high voltage level to the low voltage level. The third one-shot accelerator OS3 511' and the fourth one-shot accelerator OS4 512' together form an edge rate accelerator at the external device connection terminal B 502'. The second PMOS transistor P2 513' and the second NMOS transistor N2 514' are used to quickly pull a terminal high or low when the corresponding transition is detected at the terminal.

When the interrupt direction signal indicates that the signal is transmitted from the external device connection terminal B 502' to the host connection terminal A 501', during a rising edge, the first one-shot accelerator OS1 506' turns on the first PMOS transistor P1 508' for a short period of time, thereby reducing a transition time from the low voltage level to the high voltage level. Similarly, during a falling edge, when the signal is transmitted from the external device connection terminal B 502' to the host connection terminal A 501', the second one-shot accelerator OS2 507' turns on the first NMOS transistor N1 509' for a short period of time, thereby speeding up a transition from the high voltage level to the low voltage level. The first one-shot accelerator OS1 506', the second one-shot accelerator OS2 507', the first PMOS transistor P1 508', the first NMOS transistor N1 509' together form another edge rate accelerator at the host connection terminal A 501', which is used to force the voltage level of the host connection terminal A 501' to quickly rise or fall when a corresponding transition is detected at the external device connection terminal B 502'. The second PMOS transistor P2 513' and the second NMOS transistor N2 514' are used to quickly pull a terminal high or low when the corresponding transition is detected at the terminal. The third one-shot accelerator OS3 511', the fourth one-shot accelerator OS4 512', the second PMOS transistor P2 513', the second NMOS transistor N2 514' together form another edge rate accelerator at the external device connection terminal B 502', which is used to force the voltage level of the external device connection terminal B 502' to quickly rise or fall when a corresponding transition is detected at the host connection terminal A 501'.

In addition, the level-shifter 303' further includes some resistors, such as a resistor RPUA, a resistor RPUB, a resistor R1, and a resistor R2. the level-shifter 303' further includes other transistors. The connection relationship thereof is clearly shown in FIG. 5B. Further description is omitted.

As such, the level-shifter 303' shown in FIG. 5B may convert the voltage level between the host and the external device according to the interrupt direction signal.

Note that the above examples illustrate the circuit structures of two level-shifters. However, the present disclosure is not limited by the above examples. Other circuit structures that can perform the voltage level conversion according to the interrupt direction signal may also be included in the scope of the present disclosure.

Figure 6:
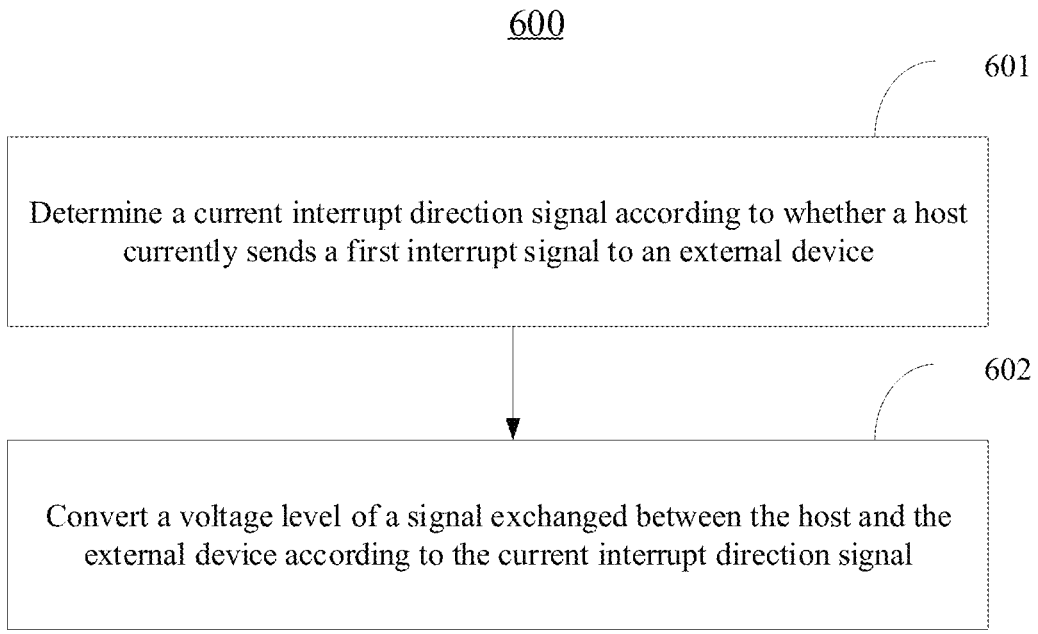
FIG. 6 illustrates a flowchart of an exemplary LPC serial interrupt method according to some embodiments of the present disclosure.

FIG. 6 illustrates a flowchart of an exemplary LPC serial interrupt method 600 according to some embodiments of the present disclosure.

As shown in FIG. 6, the LPC serial interrupt method 600 includes: determining a current interrupt direction signal according to whether a host currently sends a first interrupt signal to an external device (step 601); and converting a voltage level of a signal exchanged between the host and the external device according to the current interrupt direction signal (step 602).

Figure 7:
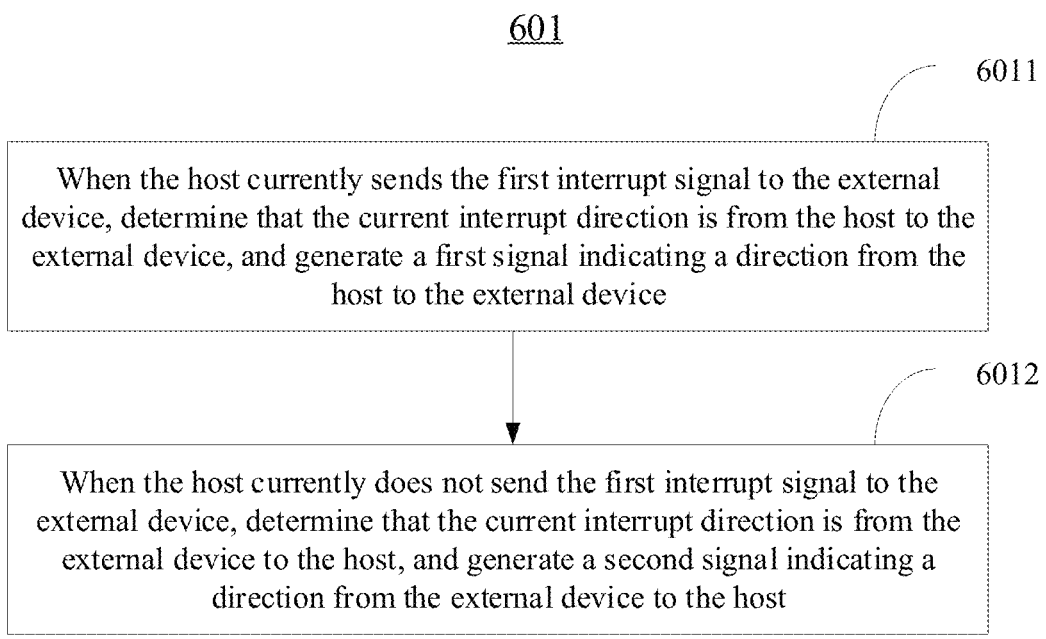
FIG. 7 illustrates a flowchart of determining a current interrupt direction signal in an exemplary LPC serial interrupt method according to some embodiments of the present disclosure.

FIG. 7 illustrates a flowchart of determining a current interrupt direction signal (step 601) in an exemplary LPC serial interrupt method 600 according to some embodiments of the present disclosure.

As shown in FIG. 7, step 601 includes: determining that the current interrupt direction signal is from the host to the external device and generating a first signal indicating a direction from the host to the external device when the host currently sends a first interrupt signal to the external device (step 6011); and determining that the current interrupt direction signal is from the external device to the host and generating a second signal indicting a direction from the external device to the host when the host currently does not send the first interrupt signal to the external device (step 6012).

In some embodiments, the first interrupt signal includes one of an interrupt start signal and an interrupt end signal.

In some embodiments, step 6012 further includes: determining that the external device currently sends a second interrupt signal to the host when the host currently does not send the first interrupt signal to the external device, determining that the current interrupt direction signal is from the external device to the host, and generating the second signal indicating the direction from the external device to the host.

In some embodiments, the second interrupt signal includes an external device interrupt identification signal.

Figure 8:
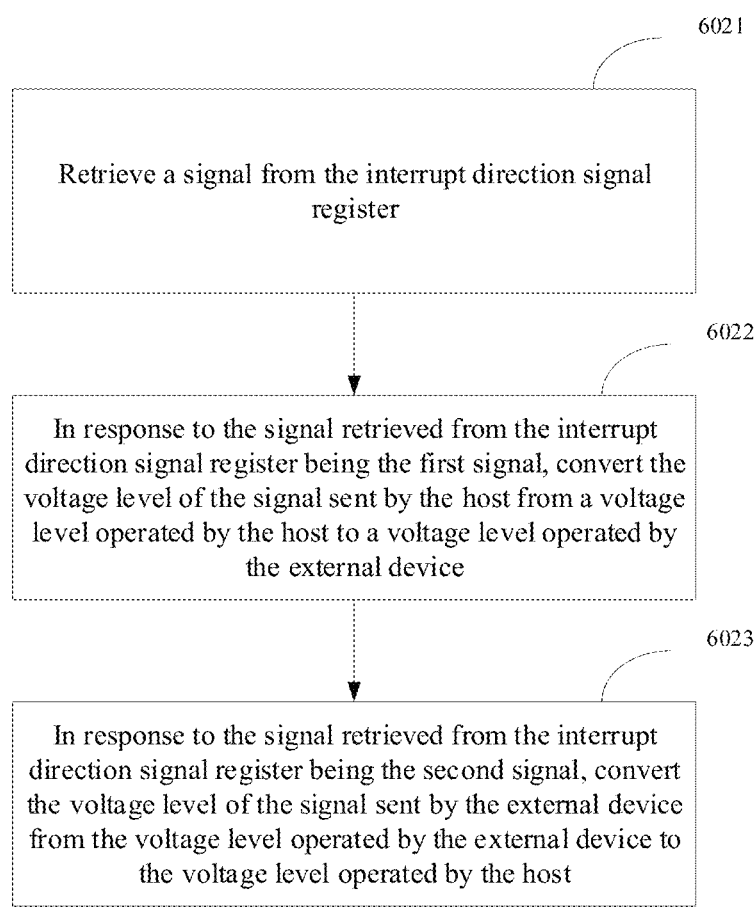
FIG. 8 illustrates a flowchart of converting a voltage level in an exemplary LPC serial interrupt method according to some embodiments of the present disclosure.

FIG. 8 illustrates a flowchart of converting a voltage level (step 602) in an exemplary LPC serial interrupt method 600 according to some embodiments of the present disclosure.

In some embodiments, the method 600 further includes: using an interrupt direction signal register to register the currently generated first signal or second signal. Step 602 includes: retrieving a signal from the interrupt direction signal register (step 6021); changing the voltage level of the signal transmitted by the host from the voltage level suitable for the host to the voltage level suitable for the external device if the retrieved signal is the first signal (step 6022); and changing the voltage level of the signal transmitted by the external device from the voltage level suitable for the external device to the voltage level suitable for the host if the retrieved signal is the second signal (step 6023).

In some embodiments, the method 600 further includes: implementing, in a CPLD device or a FPGA device, the conversion of the voltage level of the signals exchanged between the host and the external device.

In some embodiments, a first level-shifter is used to convert the voltage of the signals exchanged between the host and the external device according to the current interrupt direction signal.

The first level-shifter includes: a host connection terminal connected to the host and an external device connection terminal connected to the external device, a host power supply and an external device power supply, a first inverter, a first PMOS transistor, and a first NMOS transistor. A first input terminal of the first inverter is connected to the host connection terminal, and a second input terminal of the first inverter receives the interrupt direction signal. When the interrupt direction signal indicates that a signal is currently sent from the host to the external device, the interrupt direction signal enables the first inverter. When the interrupt direction signal indicates that a signal is currently sent from the external device to the host, the interrupt direction signal disables the first inverter. A drain electrode of the first PMOS transistor is connected to the external device power supply. A source electrode of the first PMOS transistor is connected to the external device connection terminal and a drain electrode of the first NMOS transistor. A gate electrode of the first PMOS transistor is connected to an output terminal of the first inverter. A source electrode of the first NMOS transistor is grounded. A gate electrode of the first NMOS transistor is connected to the output terminal of the first inverter.

In some embodiments, converting the voltage level of the signals exchanged between the host and the external device according to the current interrupt direction signal further includes: when the interrupt direction signal indicates that the signal is currently sent from the host to the external device, enabling the first inverter to make the output terminal of the first inverter output a low voltage level, which turns off the first NMOS transistor and turns on the first PMOS transistor, thereby changing the voltage level that the external device connection terminal outputs to the external device to the external device power supply voltage; and when the interrupt direction signal indicates that the signal is currently sent from the external device to the host, disabling the first inverter.

In some embodiments, the first level-shifter further includes: a second inverter, a second PMOS transistor, and a second NMOS transistor. A first input terminal of the second inverter is connected to the external device connection terminal. A second input terminal of the second inverter receives the interrupt direction signal. When the interrupt direction signal indicates that the signal is currently sent from the host to the external device, the interrupt direction signal disables the second inverter. When the interrupt direction signal indicates that the signal is currently sent from the external device to the host, the interrupt direction signal enables the second inverter. A drain electrode of the second PMOS transistor is connected to the host power supply. A source electrode of the second PMOS transistor is connected to the host connection terminal and a drain electrode of the second NMOS transistor. A gate electrode of the second PMOS transistor is connected to an output terminal of the second inverter. A source electrode of the second NMOS transistor is grounded. A gate electrode of the second NMOS transistor is connected to the output terminal of the second inverter.

In some embodiments, converting the voltage level of the signals exchanged between the host and the external device according to the current interrupt direction signal further includes: when the interrupt direction signal indicates that the signal is currently sent from the host to the external device, disabling the second inverter, and when the interrupt direction signal indicates that the signal is currently sent from the external device to the host, enabling the second inverter to make the output terminal of the second inverter output a low voltage level, which turns off the second NMOS transistor and turns on the second PMOS transistor, thereby changing the voltage level that the host connection terminal outputs to the host to the host power supply voltage.

In some embodiments, a second level-shifter is used to convert the voltage level of the signals exchanged between the host and the external device according to the current interrupt direction signal.

The second level-shifter includes: a host connection terminal connected to the host and an external device connection terminal connected to the external device, a host power supply and an external device power supply, a first converter, a first PMOS transistor, a first NMOS transistor, a second converter, a second PMOS transistor, and a second NMOS transistor. A first input terminal of the first converter is connected to the external device connection terminal, a second input terminal of the first inverter receives the interrupt direction signal from the interrupt direction signal generator, and an output terminal of the first converter is connected to input terminals of a first one-shot accelerator and a second one-shot accelerator. A drain electrode of the first PMOS transistor is connected to the host power supply. A source electrode of the first PMOS transistor is connected to the host connection terminal and a drain electrode of the first NMOS transistor. A gate electrode of the first PMOS transistor is connected to an output terminal of the first one-shot accelerator. A source electrode of the first NMOS transistor is grounded. A gate electrode of the first NMOS transistor is connected to an output terminal of the second one-shot accelerator. A first input terminal of the second converter is connected to the host connection terminal. A second input terminal of the second converter receives the interrupt direction signal from the interrupt direction signal generator. An output terminal of the second converter is connected to input terminals of a third one-shot accelerator and a fourth one-shot accelerator. A drain electrode of the second PMOS transistor is connected to the external device power supply. A source electrode of the second PMOS transistor is connected to the external connection terminal and a drain electrode of the second NMOS transistor. A gate electrode of the second PMOS transistor is connected to an output terminal of the third one-shot accelerator. A source electrode of the second NMOS transistor is grounded. A gate electrode of the second NMOS transistor is connected to an output terminal of the fourth converter.

In some embodiments, when the interrupt direction signal indicates that the signal is transmitted from the external device to the host, during a rising edge, the first one-shot accelerator turns on the first PMOS transistor. During a falling edge, when the interrupt direction signal indicates that the signal is transmitted from the external device to the host, the second one-shot accelerator turns on the first NMOS transistor.

In some embodiments, the method 600 further includes: configuring to register an interrupt mask bit, and masking the external device from sending the second interrupt signal to the host when the interrupt mask bit is a pre-determined bit.

As such, no complicated circuit design is needed to rapidly and efficiently shift the voltage level of the signals exchanged between the host and the external device according to the current interrupt direction signal.

Figure 9:
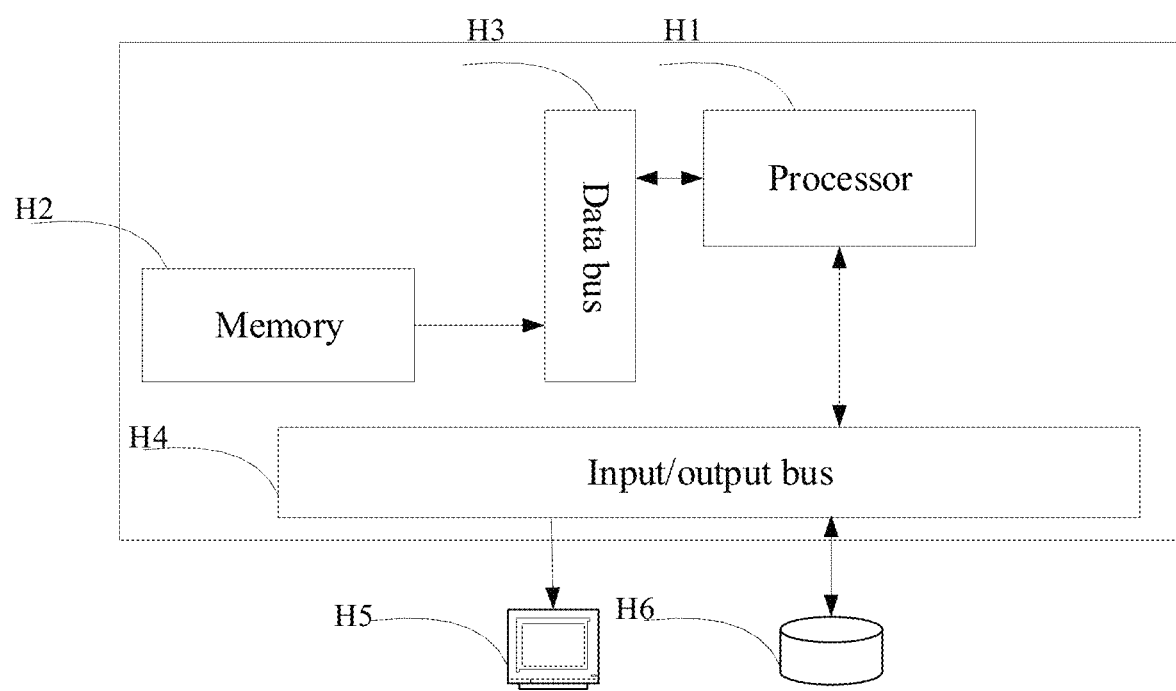
FIG. 9 illustrates a schematic block diagram of an exemplary computer system for implementing various interrupt methods according to some embodiments of the present disclosure.

FIG. 9 illustrates a schematic block diagram of an exemplary computer system for implementing various interrupt methods according to some embodiments of the present disclosure. As shown in FIG. 9, the computer system includes a processor H1, a memory H2 coupled with the processor H1 and storing computer-executable instructions therein for performing various methods of the embodiments of the present disclosure when being executed by the processor H1.

The processor H1 may include, but is not limited to, for example, one or more processors or microprocessors.

The memory H2 may include, but is not limited to, for example, a random-access memory (RAM), a read-only memory (ROM), a flash memory, an erasable programmable read-only memory (EPROM), an electrically erasable programmable read-only memory (EEPROM), a register, a computer storage medium (e.g., a hard disk, a floppy disk, a solid-state hard drive, a removable disc, a compact disc read-only memory (CD-ROM), a digital versatile disc-read only memory (DVD-ROM), a Blue-ray disc, etc.), or a combination thereof.

In addition, the computer system may further include a data bus H3, an input/output bus H4, a display H5, and an input/output device H6 (e.g., a keyboard, a mouse, a speaker, etc.), or a combination thereof.

The processor H1 may use the input/output bus H4 to communicate with external devices (e.g., H5, H6) through a wired or wireless network (not shown).

The memory H2 may further store at least one computer-executable instruction for executing each function and/or method step in the embodiments of the present disclosure when being executed by the processor H1.

In some embodiments, the at least one computer-executable instruction may also be compiled or formed into an LPC serial interrupt software product, where one or more computer-executable instructions are executed to implement each function and/or method step in the embodiments of the present disclosure when being executed by the processor H1.

The above-described embodiments are only examples and not limitations. Based on the ideas and concepts of the present disclosure, those skilled in the art may combine and re-arrange some functions, method steps, and/or some devices from the separately-described embodiments to achieve effects of the present disclosure. The embodiments formed by combining and re-arranging are within the scope of the present disclosure, and the detailed description is omitted herein.

Note that the advantages, benefits, and effects described in the present disclosure are intended to be exemplary and not limiting. The advantages, benefits, and effects cannot be construed as necessary for each and every embodiment of the present disclosure. In addition, the specific details disclosed above are only for illustrative purposes and assisting comprehension rather than limiting. The specific details disclosed do not limit the present disclosure to the specific details to be implemented.

The block diagrams of components, apparatus, devices, and systems involved in the present disclosure are merely illustrative examples and are not intended to require or imply that they must be connected, arranged, and configured in the manner shown in the block diagrams. As those skilled in the art will recognize, these components, apparatus, devices, and systems may be connected, arranged, and configured in different manners. Words such as "include", "contain", "have", etc. are open vocabulary and mean "including but not limited to" and are used interchangeably. The teams "or" and "and" are used herein to refer to the term "and/or", and are used interchangeably, unless clearly indicated otherwise. The word "such as" used herein refers to the phrase "such as but not limited to", and both can be used interchangeably.

The flowcharts in the present disclosure and the method descriptions are merely illustrative examples and are not intended to require or imply that the steps of various embodiments must be performed in the given order. As those skilled in the art will recognize, the order of the steps in the embodiments of the present disclosure may be performed in different orders. Words such as "subsequently", "then", "next", etc. are not intended to limit the order of the steps. These words are only used to assist reader's comprehension of the description of the embodiments. Further, any reference to an element in a singular form using articles "a", "an", or "the", for example, is not to be construed as limiting the element to be singular.

In addition, the steps and devices in various embodiments of the specification are not limited to being implemented in a certain embodiment. Generally, some relevant steps and some devices in various embodiments of the specification can be combined based on the ideas and concepts of the present disclosure. Additional embodiments conceived are also included in the scope of the present disclosure.

Each function or step of the disclosed methods can be performed by any appropriate means capable of performing corresponding functions. The means may include various hardware and/or software components and/or modules, including but not limited to hardware circuits, application specific integrated circuits (ASICs), or processors.

General processors, digital signal processors (DSPs), ASICs, field programmable gate arrays (FPGAs), programmable logic devices (PLDs), discrete logic gates or transistors, discrete hardware components, or a combination thereof can be used to implement or perform logic blocks, modules, and circuits described in various embodiments. A general-purpose processor may be a microprocessor or may be any commercially available processors, controllers, microcontrollers, or state machines. The processor may also be a combination of computing devices, such as a combination of a DSP and a microprocessor, a plurality of microprocessors, a microprocessor cooperating with a DSP core, or another such combination.

The steps of the method or algorithm described in the embodiments of the present disclosure can be directly embedded in hardware, a software module executed by a processor, or a combination of both. The software module may be stored in any form of physical storage medium, which includes, but is not limited to, a random-access memory (RAM), a read-only memory (ROM), a flash memory, an erasable programmable read-only memory (EPROM), an electrically erasable programmable read-only memory (EEPROM), a register, a computer storage medium (e.g., a hard disk, a floppy disk, a solid-state hard drive, a removable disc, a compact disc read-only memory (CD-ROM), a digital versatile disc-read only memory (DVD-ROM), a Blue-ray disc, etc.), or a combination thereof. The storage medium may be coupled with the processor such that the processor can retrieve information from and write information to the storage medium. Alternatively, the storage medium may be integral to the processor. The software module may be a single instruction or a plurality of instructions, and can be distributed in different code segments, between different programs, and across multiple storage media.

The disclosed methods include actions for implementing the described methods. The methods and/or actions can be interchanged with each other without departing from the scope of claims. In other words, unless a specific order of actions is specified, the order and/or use of specific actions can be modified without departing from the scope of the claims.

The above-described functions can be implemented by hardware, software, firmware or a combination thereof. If implemented in software, the functions can be stored as instructions on a physical computer-readable medium. The storage medium may be any available physical medium that can be accessed by a computer. For illustration purpose, the computer-readable medium may include a RAM, a ROM, an EEPROM, a CD-ROM or other optical storage, a magnetic disc storage or other magnetic storage device or any other physical medium that can carry or store instructions or data structures in the form of a desired program code and can be accessed by the computer. For example, the disk and the disc used herein may include a compact disc (CD), a laser disc, an optical disc, a DVD, a floppy disk, and a Blue-ray disc, where the disk often reproduces data magnetically while the disc often use a laser to reproduce data optically.

Therefore, the computer program product may perform the described operations. For example, the computer program product may be computer-readable physical medium having instructions physically stored (and/or encoded) thereon, and the instructions can be executed by a processor to perform the operations described herein. The computer program product may include packaging materials.

Software or instructions may also be transmitted through a transmission medium. For example, a transmission medium such as a coaxial cable, a fiber optic cable, a twisted pair, a digital subscriber line (DSL), or a wireless technology such as infrared, radio, or microwave, may be used to transmit software from a website, a server, or another remote source.

In addition, the modules and/or other appropriate means used to perform the methods and technologies described herein may be downloaded by a user terminal and/or a base station and/or obtained by other means. For example, the device may be coupled with the server to facilitate the transmission of functions for performing the methods described herein. Alternatively, various methods described herein may be provided via storage components (e.g., a RAM, a ROM, a physical storage medium such as a CD or a floppy disk), such that the user terminal and/or the base station may obtain various methods by being coupled with the device or providing a storage component to the device. In addition, any other suitable techniques for providing the methods and functions described herein to the device may be utilized.

Other examples and implementations are within the scope and spirit of the present disclosure and appended claims. For example, due to the nature of software, the functions described above can be implemented using software executed by a processor, a hardware, a firmware, a hard-wired element, or a combination thereof. Features that implement functions may also be physically located in various locations, including being distributed such that parts of the functions are implemented at different physical locations. Moreover, as used herein, including the use in claims, the use of "or" in a listing of items beginning with "at least one" indicates separate listings. For example, "at least one of A, B, or C" enumerates A or B or C, or AB or AC or BC, or ABC (i.e., A and B and C). In addition, the word "exemplary" does not mean that the described example is preferred or better than other examples.

Various changes, substitutions and alterations to the technology described herein can be made without departing from the technology taught by the appended claims. In addition, the scope of the claims of the present disclosure is not limited to the specific aspects of the processing, machine, manufacturing, event composition, means, methods, and actions described above. The components, means, methods, or actions of currently existing or later developed processes, machines, manufacturing, and events can be utilized to perform substantially the same functions or achieve substantially the same results as the corresponding aspects described herein. Therefore, the appended claims include such processing, machine, manufacturing, event composition, means, methods or actions within its scope.

The above description of the disclosed aspects is provided to enable any person skilled in the art to make or use the present disclosure. Various modifications to these aspects are obvious to those skilled in the art, and the general principles defined herein can be applied to other aspects without departing from the scope of the present disclosure. Therefore, the present disclosure is not intended to be limited to the aspects shown, but in accordance with the broadest scope consistent with the principles and novel features disclosed herein.

The above description has been given for purpose of illustration. IN addition, the description is not intended to limit the embodiments of the present disclosure to the form disclosed herein. Although a number of example aspects and embodiments have been described above, those skilled in the art will recognize certain variations, modifications, changes, additions, and sub-combinations thereof.

Although general descriptions and specific implementations have been used above to describe the present disclosure in detail, some modifications or improvements can be made on the basis of the embodiments of the present disclosure, which is obvious to those skilled in the art.

Therefore, these modifications or improvements made without departing from the spirit of the present disclosure all fall within the scope of protection claimed by the present disclosure.

The above descriptions are merely exemplary implementations of the present disclosure, and are not used to limit the protection scope of the present disclosure, which is determined by the appended claims.

What is claimed is:

1. A low pin count (LPC) bus serial interrupt system, comprising:
   an interrupt direction signal generator configured to determine a current interrupt direction signal according to whether a host currently sends a first interrupt signal to an external device; and
   a level-shifter configured to convert a voltage level of a signal exchanged between the host and the external device according to the current interrupt direction signal,
   wherein the level-shifter is configured to:
      in response to the interrupt direction signal indicating that the signal is currently sent from the host to the external device, change the voltage level of the signal from a voltage level operated by the host to a voltage level operated by the external device; and
      in response to the interrupt direction signal indicating that the signal is sent from the external device to the host, change the voltage level of the signal from the voltage level operated by the external device to the voltage level operated by the host.

2. The system according to claim 1, wherein determining the current interrupt direction signal by the interrupt direction signal generator according to whether the host currently sends the first interrupt signal to the external device includes:
   when the host currently sends the first interrupt signal to the external device, determining that the current interrupt direction is from the host to the external device, and generating a first signal indicating a direction from the host to the external device; and
   when the host currently does not send the first interrupt signal to the external device, determining that the current interrupt direction is from the external device to the host, and generating a second signal indicating a direction from the external device to the host.

3. The system according to claim 2, wherein:
   the first interrupt signal includes one of an interrupt start signal and an interrupt end signal.

4. The system according to claim 2, wherein the first interrupt direction signal generator is further configured to:
   when the host currently does not send the first interrupt signal to the external device, determine that the external device sends a second interrupt signal to the host, determine that the current interrupt direction signal is from the external device to the host, and generate the second signal indicating the direction from the external device to the host.

5. The system according to claim 4, wherein:
   the second interrupt signal includes an external device interrupt identification signal.

6. The system according to claim 4, further comprising:
   an interrupt direction signal register configured to register currently generated first signal or second signal,
   wherein converting, by the level-shifter, the voltage level of the signal exchanged between the host and the external device according to the current interrupt direction signal includes:
      retrieving the first signal or the second signal from the interrupt direction signal register;
      in response to retrieving the first signal from the interrupt direction signal register, converting the voltage level of the signal sent by the host from the voltage level operated by the host to the voltage level operated by the external device; and
      in response to retrieving the second signal from the interrupt direction signal register, converting the voltage level of the signal sent by the external device from the voltage level operated by the external device to the voltage level operated by the host.

7. The system according to claim 1, wherein:
   the level-shifter is implemented by a complex programmable logic device (CPLD) or field programmable gate array (FPGA) device.

8. The system according to claim 1, wherein the level-shifter is a first level-shifter, which includes:
   a host connection terminal connected to the host and an external device connection terminal connected to the external device;
   a host power supply and an external device power supply;
   a first inverter, wherein a first input terminal of the first inverter is connected to the host connection terminal, a second input terminal of the first inverter receives the interrupt direction signal, when the interrupt direction signal indicates that a signal is currently sent from the host to the external device, the first inverter is enabled, and when the interrupt direction signal indicates that the signal is currently sent from the external device to the host, the first inverter is disabled;
   a first PMOS transistor, wherein a drain electrode of the first PMOS transistor is connected to the external device power supply, a source electrode of the first PMOS transistor is connected to the external device connection terminal and a drain electrode of a first NMOS transistor, and a gate electrode of the first PMOS transistor is connected to an output terminal of the first inverter; and
   the first NMOS transistor, wherein a source electrode of the first NMOS transistor is grounded, and a gate electrode of the first NMOS transistor is connected to the output terminal of the first inverter.

9. The system according to claim 8, wherein:
   in response to the interrupt direction signal indicating that the signal is currently sent from the host to the external device, the first inverter is enabled, and the output terminal of the first inverter outputs a low voltage level to turn off the first NMOS transistor and turn on the first PMOS transistor, thereby changing the voltage level that the external device connection terminal outputs to the external device to a voltage level of the external device power supply; and
   in response to the interrupt direction signal indicating that the signal is sent from the external device to the host, the first inverter is disabled.

10. The system according to claim 8, wherein the first level-shifter further includes:
   a second inverter, wherein a first input terminal of the second inverter is connected to the external device connection terminal, a second input terminal of the second inverter receives the interrupt direction signal, when the interrupt direction signal indicates that a signal is currently sent from the host to the external device, the second inverter is disabled, and when the interrupt direction signal indicates that the signal is currently sent from the external device to the host, the second inverter is enabled;

a second PMOS transistor, wherein a drain electrode of the second PMOS transistor is connected to the host power supply, a source electrode of the second PMOS transistor is connected to the host connection terminal and a drain electrode of a second NMOS transistor, and a gate electrode of the second PMOS transistor is connected to an output terminal of the second inverter; and the second NMOS transistor, wherein a source electrode of the second NMOS transistor is grounded, and a gate electrode of the second NMOS transistor is connected to the output terminal of the second inverter.

11. The system according to claim 10, wherein:

in response to the interrupt direction signal indicating that the signal is currently sent from the host to the external device, the second inverter is disabled; and in response to the interrupt direction signal indicating that the signal is sent from the external device to the host, the second inverter is enabled, and the output terminal of the second inverter outputs a low voltage level to turn off the second NMOS transistor and turn on the second PMOS transistor, thereby changing the voltage level that the host connection terminal outputs to the host device to a voltage level of the host power supply.

12. The system according to claim 1, wherein the level-shifter is a second level-shifter, which includes:

a host connection terminal connected to the host and an external device connection terminal connected to the external device;

a host power supply and an external device power supply;

a first converter, wherein a first input terminal of the first converter is connected to the external device connection terminal, a second input terminal of the first converter receives the interrupt direction signal from the interrupt direction signal generator, and an output terminal of the first converter is connected to input terminals of a first one-shot accelerator and a second one-shot accelerator;

a first PMOS transistor, wherein a drain electrode of the first PMOS transistor is connected to the host power supply, a source electrode of the first PMOS transistor is connected to the host connection terminal and a drain electrode of a first NMOS transistor, and a gate electrode of the first PMOS transistor is connected to an output terminal of the first one-shot accelerator;

the first NMOS transistor, wherein a source electrode of the first NMOS transistor is grounded, and a gate electrode of the first NMOS transistor is connected to an output terminal of the second one-shot accelerator;

a second converter, wherein a first input terminal of the second converter is connected to the host connection terminal, a second input terminal of the second converter receives the interrupt direction signal from the interrupt direction signal generator, and an output terminal of the second converter is connected to input terminals of a third one-shot accelerator and a fourth one-shot accelerator;

a second PMOS transistor, wherein a drain electrode of the second PMOS transistor is connected to the external device power supply, a source electrode of the second PMOS transistor is connected to the external device connection terminal and a drain electrode of a second NMOS transistor, and a gate electrode of the second PMOS transistor is connected to an output terminal of the third one-shot accelerator; and the second NMOS transistor, wherein a source electrode of the second NMOS transistor is grounded, and a gate electrode of the second NMOS transistor is connected to an output terminal of the fourth one-shot accelerator.

13. The system according to claim 12, wherein:

in response to the interrupt direction signal indicating that the signal is currently sent from the external device to the host, during a rising edge, the first one-shot accelerator turns on the first PMOS transistor; and during a falling edge, in response to the interrupt direction signal indicating that the signal is sent from the external device to the host, the second one-shot accelerator turns on the first NMOS transistor.

14. The system according to claim 1, further comprising:

an interrupt mask register configured to register an interrupt mask bit, which is used to mask the second interrupt signal from the external device to the host in response to the interrupt mask bit being a pre-determined bit.

15. A low bit count (LPC) bus serial interrupt method, comprising:

determining a current interrupt direction signal according to whether a host currently sends a first interrupt signal to an external device; and converting a voltage level of a signal exchanged between the host and the external device according to the current interrupt direction signal, wherein a level-shifter is configured to:

in response to the interrupt direction signal indicating that the signal is currently sent from the host to the external device, change the voltage level of the signal from a voltage level operated by the host to a voltage level operated by the external device; and in response to the interrupt direction signal indicating that the signal is sent from the external device to the host, change the voltage level of the signal from the voltage level operated by the external device to the voltage level operated by the host.

16. The method according to claim 15, wherein determining the current interrupt direction signal according to whether the host currently sends the first interrupt signal to the external device includes:

when the host currently sends the first interrupt signal to the external device, determining that the current interrupt direction is from the host to the external device, and generating a first signal indicating a direction from the host to the external device; and when the host currently does not send the first interrupt signal to the external device, determining that the current interrupt direction is from the external device to the host, and generating a second signal indicating a direction from the external device to the host.

17. The method according to claim 16, wherein:

the first interrupt signal includes one of an interrupt start signal and an interrupt end signal.

18. The method according to claim 15, wherein when the host currently does not send the first interrupt signal to the external device, determining that the current interrupt direction signal is from the external device to the host includes:

when the host currently does not send the first interrupt signal to the external device, determining that the external device sends a second interrupt signal to the host, determining that the current interrupt direction signal is from the external device to the host, and generating the second signal indicating the direction from the external device to the host.

19. The method according to claim 18, wherein:
the second interrupt signal includes an external device interrupt identification signal.

20. A non-transitory computer-readable storage medium storing a low pin count (LPC) bus serial interrupt software product, comprising:
one or more computer-executable instructions, wherein when being executed by a processor, the one or more computer-executable instructions performs:
determining a current interrupt direction signal according to whether a host currently sends a first interrupt signal to an external device; and
converting a voltage level of a signal exchanged between the host and the external device according to the current interrupt direction signal,
wherein a level-shifter is configured to:
in response to the interrupt direction signal indicating that the signal is currently sent from the host to the external device, change the voltage level of the signal from a voltage level operated by the host to a voltage level operated by the external device; and
in response to the interrupt direction signal indicating that the signal is sent from the external device to the host, change the voltage level of the signal from the voltage level operated by the external device to the voltage level operated by the host.

* * * * *